United States Patent [19]

Brice, Jr. et al.

[11] Patent Number: 4,825,206

[45] Date of Patent: Apr. 25, 1989

[54] AUTOMATIC FEEDBACK OF NETWORK TOPOLOGY DATA

[75] Inventors: Frank W. Brice, Jr., Kingston; Robert A. Weingarten, Highland Mills, both of N.Y.

[73] Assignee: International Business Machines Corporation, Armonk, N.Y.

[21] Appl. No.: 191,757

[22] Filed: May 3, 1988

Related U.S. Application Data

[63] Continuation of Ser. No. 795,053, Nov. 4, 1985, abandoned.

[51] Int. Cl.[4] .......................... H04J 1/16; H04Q 5/20
[52] U.S. Cl. ............................... 340/825.02; 340/827; 370/94; 370/16
[58] Field of Search .................... 340/825.02, 825.03, 340/827; 370/54, 60, 89, 94, 95, 16

[56] References Cited

U.S. PATENT DOCUMENTS

| | | | |
|---|---|---|---|
| 3,906,164 | 9/1975 | Philip et al. | 370/54 |
| 4,022,982 | 5/1977 | Hemdal | 370/54 |
| 4,320,500 | 3/1982 | Barberis et al. | 370/94 |
| 4,399,531 | 8/1983 | Grande et al. | 370/94 |
| 4,550,397 | 10/1985 | Turner et al. | 370/94 |
| 4,551,833 | 11/1985 | Turner | 370/94 |
| 4,577,311 | 3/1986 | Duquesne et al. | 370/94 |
| 4,644,532 | 2/1987 | George et al. | 370/94 |
| 4,661,947 | 4/1987 | Lea et al. | 370/94 |

FOREIGN PATENT DOCUMENTS 2208396 8/1973 Fed. Rep. of Germany ...................... 340/825.02

OTHER PUBLICATIONS

"SNA Routing: Past, Present, and Possible Future"; *IBM Systems Journal;* Jaffe et al.; vol. 22; No. 4; (1983).
"Routing and Flow Control in TYMNET"; *IEEE Transactions on Communications;* vol. COM-29, No. 4; Tymes; 1981.
"The New Routing Algorithm for the ARPANET;" *IEEE Transactions on Communications;* vol. COM-28, No. 5, McQuillan et al.; 1980.

*Primary Examiner*—Robert L. Griffin
*Assistant Examiner*—Ralph E. Smith
*Attorney, Agent, or Firm*—Mark S. Walker; J. Dennis Moore

[57] ABSTRACT

An automatic feedback mechanism in a communications network having dynamic routing. The invention detects the failure of an element in a route that is either in the process of being created or has been created and is being used. The invention provides a means for sending information as to the failure of the element back to the node originating the communication and, if the route had been established, to the destination node as well. The information sent back is used to update the network topology data base of the receiving node for subsequent route creation decisions by that node. In this way, proliferation of status messages in a communications network is avoided.

10 Claims, 4 Drawing Sheets

FIG.3
| 50 | 12' | 16' | 32' | 12' | 34' | 18' | 10' | 14' |
| --- | --- | --- | --- | --- | --- | --- | --- | --- |
| 52 | 12' | 16' | 36' | 14' | | | | |
| 54 | 12' | 16' | 40' | 18' | 10' | 14' | | |
| | | | | | | | | |
| | | | | | | | | |
| | | | | | | | | |
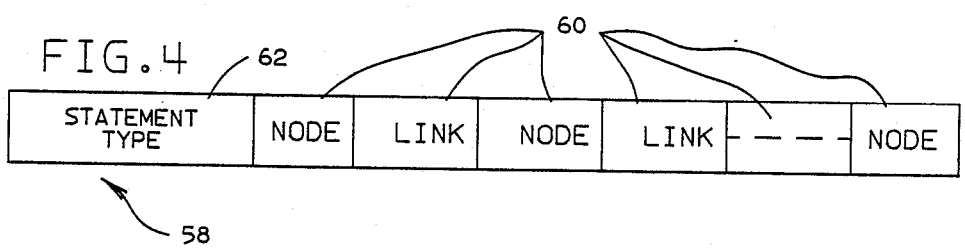
FIG.4
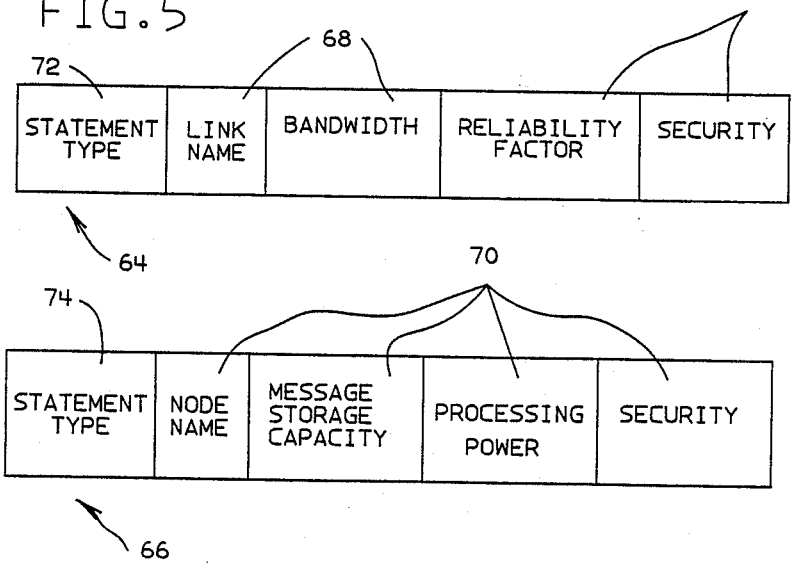
FIG.5

FIG. 3
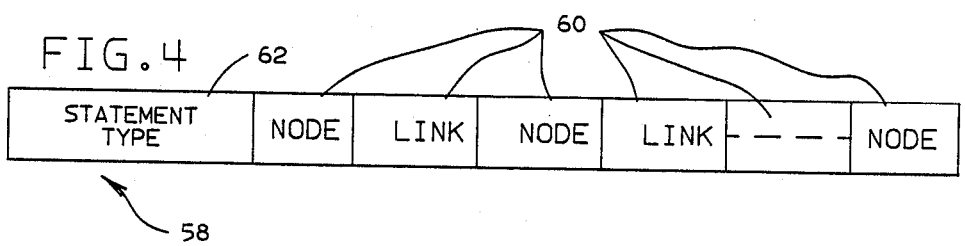
FIG. 4
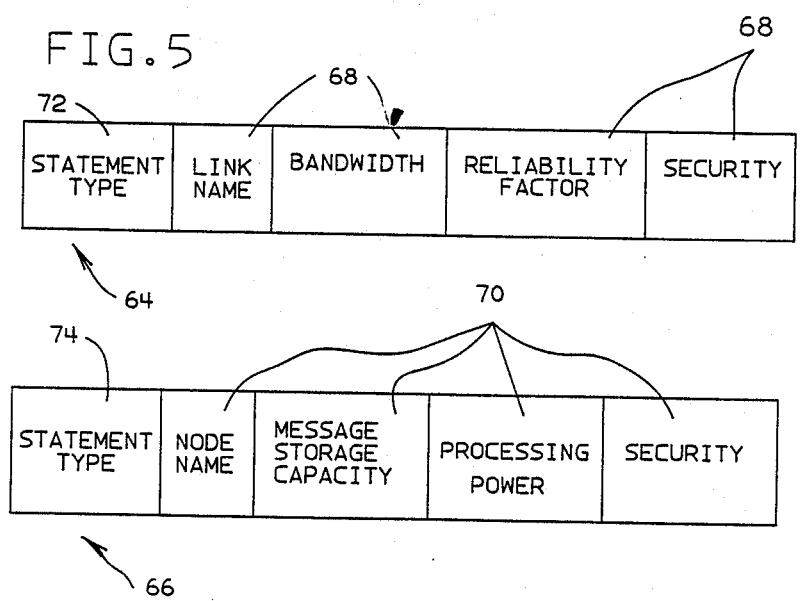
FIG. 5

AUTOMATIC FEEDBACK OF NETWORK TOPOLOGY DATA

This is a continuation of application Ser. No. 06/795,053 filed Nov. 4, 1985, now abandoned.

BACKGROUND OF THE INVENTION

1. Field of the Invention

The present invention relates to communication networks, and more particularly to such networks in which the path, or route, that a message takes through the network is computed dynamically, that is, the path is determined anew each time a communication session between two users of the network is established.

2. Background Art

Communication networks are arrangements of computers, communication controllers and associated peripheral equipment and links which allow "end users" located at remote locations in the network to establish and maintain communication of information. An end user in this context may be a human user at some type of terminal, or an application program running on a host computer or on some type of intelligent device controller (i.e., workstation, personal computer, display controller, etc.). FIG. 1 illustrates a small communication network 10. In it, two IBM System 370 host computers 12, 14 and three IBM 3725 Communications Controllers 16, 18, 20 are interconnected, supporting five terminals 22, 24, 26, 28, 30 connected as shown. Communication links 32, 34, 36, 38, 40, 44, interconnect the computers 12, 14 and controllers 16, 18, 20 as shown.

Communication between, say, terminal 30 and host computer 12 in FIG. 1 would be possible over several different paths. In order to visualize the communication in a network, a convention has been adopted in which the computers and communication controllers in a network are referred to collectively as nodes and the connections between nodes as links. End-user devices, whether displays, printers, etc. are referred to collectively as terminals. FIG. 2 depicts a node and link diagram of the network 10 shown in FIG. 1, with like elements in FIG. 2 having the same reference numerals as in FIG. 1, but primed. Terminals are not shown in the diagram, since they are not directly involved in the communication establishment and control process to which the present invention is related.

A conversation, called a session, between an end user at terminal 30 and an application program in host computer 12 in FIG. 1 would involve communication between nodes 12 and 18, or 12' and 18' in FIG. 2. Several different paths are possible for such a session. For example, communication could be simply via link 34', or the path could involve links 32' and 40' and node 16'. Alternatively, the path could involve links 32', 36' and 38' and nodes 16' and 14'. The choices increase with the size and complexity of the network.

Except in very limited circumstances in which the network is fully connected, the information input at an origin node (supporting one end user) travels through one or more intermediate nodes before reaching the destination node (supporting the other end user). Information transmitted by one node and directed to another node must travel over the links interconnecting the nodes. In some networks, all information transmitted between two end users during a specific communication session traverses the same path, called in that case a route. The mechanism used to create the route, hereafter called the route mechanism, is dependent on a specific network architecture.

Most network routing mechanisms use routing tables in each node (origin, intermediate, and destination) to forward messages to the next node. Routing mechanisms may vary but several use an index into a routing table (the index being either a route identifier or a combination of source and/or destination node identifiers) to specify to which outbound link, and therefore to which next adjacent network node, the message is to be sent. Naturally when the message reaches the destination node, the message is not forwarded to another intermediate node, but is instead processed by the end user.

The routing tables in each network node can be established either statically or dynamically. In the static case, the routing definitions are fixed when network operating is started. The static mechanism is not relevant to the invention and will therefore not be discussed.

In dynamic routing, a route creation technique is employed that dynamically creates an end-to-end route, from a source node to a destination node, which can be used during a specific communication session. This end-to-end route remains defined and active until all sessions using the route terminate. Then the route can be eliminated to free network resources, such as routing table entries to be used for other dynamically created routes.

Several methods can be used to create dynamic routes within networks. One such method employs a topology data base which contains the identity of all physical nodes and links in the network, including their connectivity, status, and physical characteristics to build a route dynamically. This method selects appropriate nodes and links based on their recorded status and creates a message, hereafter called a ROUTE-SETUP message, containing a list of the nodes and links to be used in the route. The ROUTE-SETUP message traverses each node in the list, allowing each node to build an entry in its routing table so that subsequent messages for a session assigned to the route can traverse the same physical nodes identified in the ROUTE-SETUP message. Both forward and backward pointers are placed in the node routing table.

Routing in communication networks is discussed by Jaffe et al. in "SNA Routing: Past, Present, and Possible Future" appearing in the *IBM Systems Journal*, Vol. 22, No. 4 (1983), Tymes in "Routing and Flow Control in TYMNET" appearing in the *IEEE Transactions on Communications*, Vol. COM-29, No. 4, (1981), and by McQuillan et al. in "The New Routing Algorithm for the ARPANET" appearing in the *IEEE Transactions on Communications*, Vol. COM-28, No. 5, (1980).

Clearly, it is important for the topology data base to have current information as to which nodes and links are available for communication. Otherwise, attempts might be made to create routes which have unavailable nodes or links, and several route creation attempts might be necessary before an available route is actually found. This represents an unnecessary waste of network resources. Other than by manual, operator input, the reporting of the initial status, failures and reactivations of the network nodes and links, hereafter called network elements, has been done by the broadcast of status changes by adjacent nodes. The Tymes and McQuillan et al articles mentioned above describe such broadcast update methods. These broadcast status updates have the advantage of not requiring operator intervention.

However, they have the problem, especially in large and complex networks, of considerably increasing network overhead traffic. In some situations, it is preferable to accept less than perfect knowledge of the network status in order to reduce this overhead. In fact, it is necessary in such networks to have some mechanism to "kill" the broadcast message which propagates throughout the system, or else the message reverberates throughout the network forever. Typical mechanisms include the incorporation of a cutoff time, after which the message is discarded from the network. However, even with such limiting mechanisms, status update messages occupy a large proportion of the overall network message-handling capability, such that there is less capacity available for users messages.

Thus, it is apparent that there is a need for a means for updating a topology data base in a dynamic routing environment such that there are significantly reduced demands on the message handling capability of the network as compared with prior art schemes for updating topology data bases.

SUMMARY OF THE INVENTION

Accordingly, the present invention provides a digital data message transmission network including a plurality of network elements comprising message transmitting-/receiving nodes and communication links interconnecting said nodes, and storage associated with each node for storing data corresponding to the availability of the network elements to communicate. A facility is also provided with each said node for using the stored data to select communication paths made up of selected elements interconnecting that node with another node in the network. Said facility also provides for establishing said communication path. Further, a facility is provided for generating and selectively sending information as to the availability for communication of a previously unavailable element. Said information is sent to nodes that either previously attempted to, or did use a network element to communicate.

The present invention thus greatly reduces the overall status message traffic in even a complex communication network by ensuring that only the specific nodes involved in the use of an element are informed of the current status of that element.

The foregoing and other objects, features and advantages of the invention will be apparent from the more particular description of the preferred embodiments of the invention, as illustrated in the accompanying drawings.

BRIEF DESCRIPTION OF THE DRAWINGS

FIG. 3 is a schematic representation of a topology data base route table.

FIG. 4 is a schematic representation of a route statement.

FIG. 5 is a schematic representation of link and node statements.

In the drawings, like elements are designated with similar reference numbers, and identical elements in different specific embodiments are designated by identical reference numbers.

DESCRIPTION OF PREFERRED EMBODIMENT OF THE INVENTION

General Description

The feedback facility of the present invention provides a method and apparatus which can be used to dynamically report the status of the network nodes and links to topology data bases so that ROUTE-SETUP messages can be created efficiently with knowledge of the physical route element status. The description that follows is applicable to an IBM SNA network comprising, for example, IBM System 370 computers and IBM 3725 Communication Controllers as nodes, and suitable communication links for network interconnection. However, the principles and protocols are presented with sufficient generality to enable application to any communication network having dynamic routing that relies on one or more topology data bases for route creation, and local routing tables at each node for the establishment and maintenance of communication sessions.

In the preferred embodiment, each topology data base is initially set up with information as to all of the nodes and links, and their potential connectivity to adjacent nodes. This information is entered by way of conventional input statements either interactively or via batch definitions. The link and node statements further specify certain characteristics, such as line(link) transmission speed, node buffer size, and element data transmission security, which are used by end users to request a route. These characteristics are set forth below under RULES OF OPERATION, DEFINITIONS & STATES, part (a) Data Types. Additionally, each network element in the topology data base is initially marked as "assumed operative", or available. This initial status has nothing to do with the actual status of the corresponding elements, but allows the route selection technique to select the element for a route setup attempt and dynamically ascertain its actual operative or inoperative status via the feedback mechanism of the present invention. The information is stored conventionally, in such a way as to be available for scanning and comparing when a route request is received.

Figure 1:
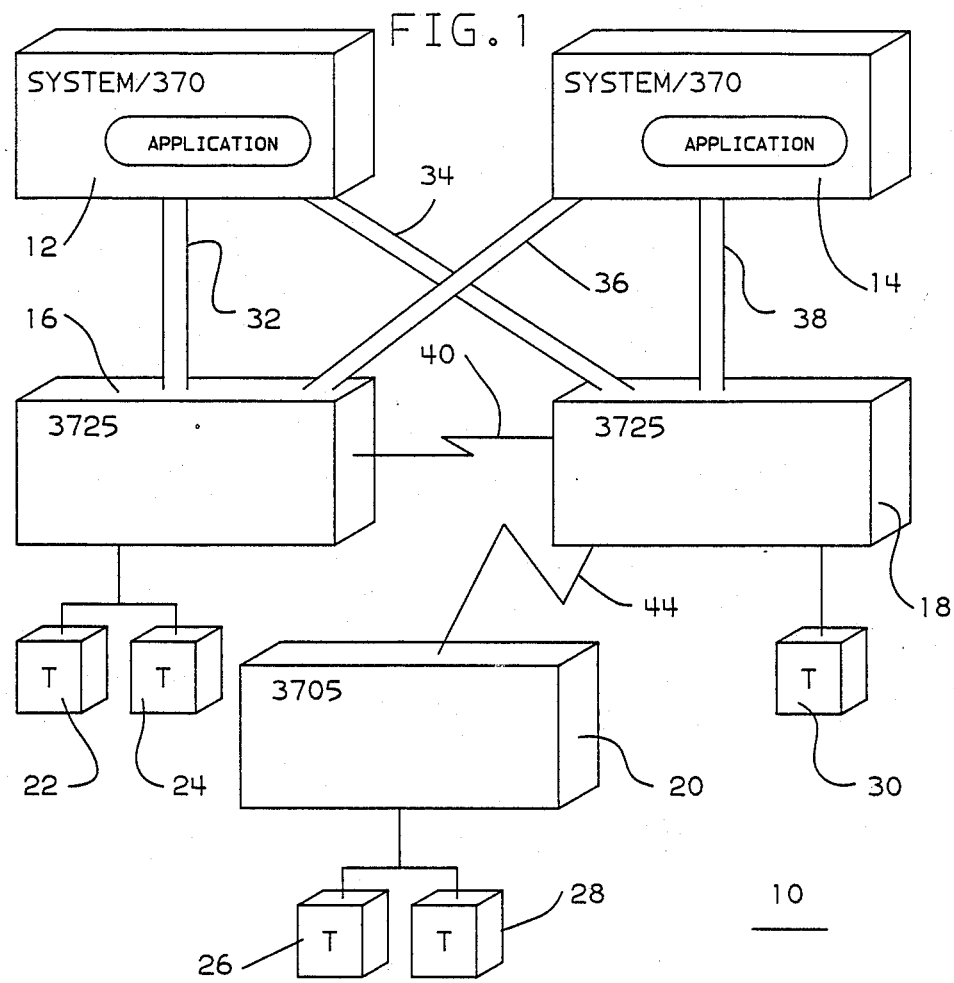
FIG. 1 is a diagram of a simple mesh type communication network.
Figure 2:
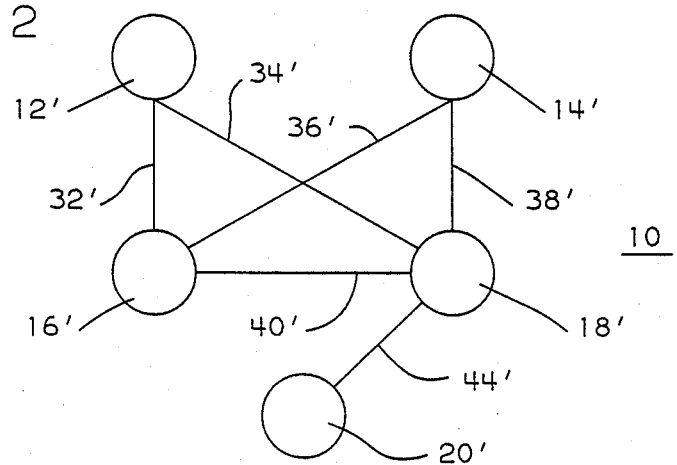
FIG. 2 is a schematic representation of the network shown in FIG. 1.

This information is entered for (1) routes, (2) links, and (3) nodes. Thus, assuming the interactive input method (as opposed to batch), a route statement is used to enter information defining a route between two nodes between which communication is to be allowed. This statement specifies the links and nodes, in order, in that route, and an identifier (ID) for that route. For each pair of nodes that may communicate, as many route statements as there are distinct routes between those nodes may be entered. FIG. 3 illustrates the topology data base entries for the potential routes between nodes 16' and 14' in FIG. 2. In this case there are three such routes: 50, 52, and 54. FIG. 4 illustrates the form of a route statement 58. Link and node names 60 are placed in the sequence in which a message traverses that route, starting with the origin node and ending with the destination node. The statement type 62 identifies the statement as a route statement.

FIG. 5 illustrates a link statement 64 and a node statement 66, showing the various fields 68, 70 identifying the element and containing data for the aforementioned characteristics. The statement type 72, 74, identifies the statements as link or node statements, respectively. The information entered via the route, link and node statements is conventionally stored in such a way as to be available for scanning and comparing when a route request is received, so as to, first, retrieve all routes identified between the specified end nodes, and, second, find the best match of characteristics for the elements in the selected routes against the specified characteristics and thereby select the best route.

Figure 6:
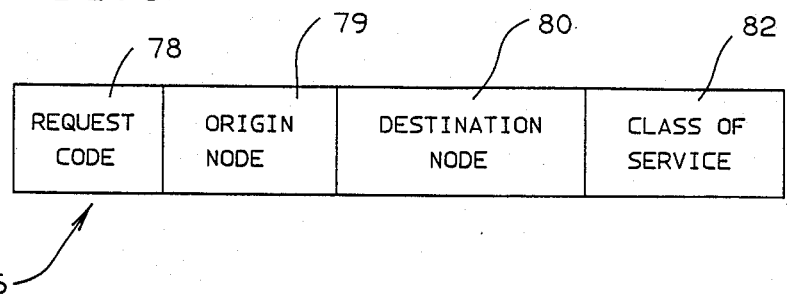
FIG. 6 is a schematic representation of a ROUTE REQUEST message.

When an end user desires to communicate with another end user, a session is requested of the control program resident in the origin node. The session request includes the names of the source and destination nodes supporting the end users and a class of service. The class of service is a conventional shorthand for a set of the aforementioned characteristics of the route to be selected. In the preferred embodiment, the information in the session request is forwarded in a message, hereafter called a ROUTE REQUEST message, to the nearest available topology data base for the selection of a route. FIG. 6 illustrates a ROUTE REQUEST message 76. It comprises a request code 78, identifying the message as a ROUTE REQUEST, the origin node name 79, the destination node name 80, and the class of service name 82.

Figure 7:
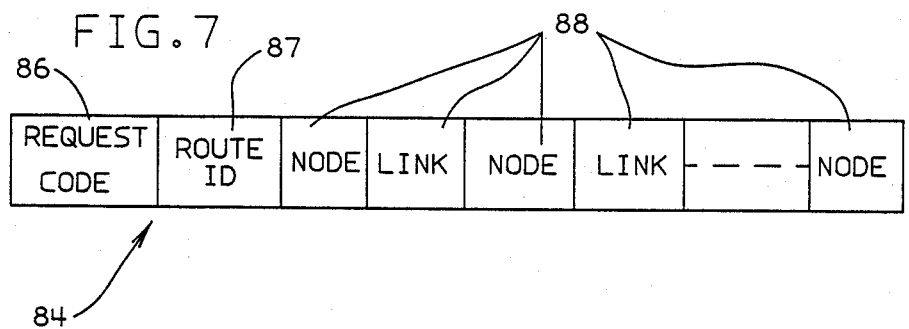
FIG. 7 is a schematic representation of a ROUTE-SETUP message.

Upon receipt of the ROUTE REQUEST message, the topology data base selects a potential route whose elements conform to the characteristics identified in the specified class of service. If a route with the same exact set of elements is already in use with the same characteristics, the session will be assigned to the already created route. If a route has not already been created, the topology data base is scanned to select the best route between the source and destination nodes, based on the match of actual element characteristics against the characteristics requested. Only nodes and links which are assumed or known to be operative can be selected in this process. The selected route is then described in a message containing a list of nodes and links comprising the route, along with a unique route identifier (route ID) for that route, hereafter called a ROUTE-SETUP message. FIG. 7 illustrates a ROUTE-SETUP message 84. The request code 86 identifies the message as a ROUTE-SETUP message. The route ID 87 identifies the route. The node names and link names 88 appear in the sequence a message travels on the route, as in the route statement 58 (FIG. 4, supra).

Route elements are assumed initially to be operative, because when the topology data base is activated, the status of each network element is unknown. Rather than initially obtaining the status of each element defined in the topology data base through operator input, exchanges with other data bases, or queries of each network element, the status is learned as sessions are requested by using the preferred embodiment of the present invention herein described.

As the ROUTE-SETUP message traverses the network, each active node creates routing table entries in conventional fashion for both directions of the communication. That is, when the ROUTE-SETUP message is processed, an entry is made in the routing table, containing the route ID (including origin and destination node names or addresses) and the outbound link address. As is known, this permits quick routing of messages thereafter via the route ID accompanying the message. When a message arrives with this information, a simple table scan yields the outbound link address, which is sufficient for sending the message on its way.

Figure 8:
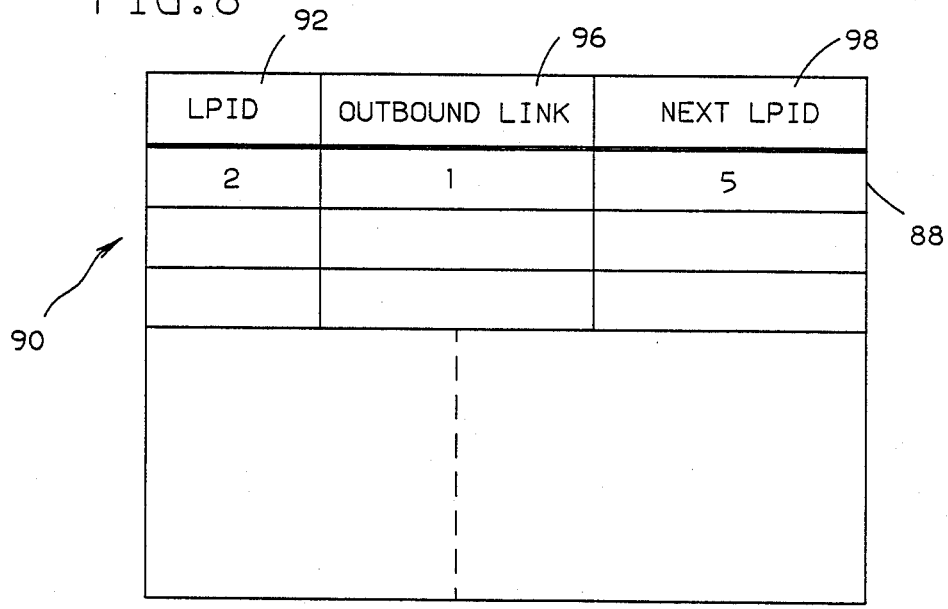
FIG. 8 is a schematic representation of a routing table.

In an alternative embodiment, the route ID is reduced to a single Local Path Identifier (LPID) in each node, which may be a sequentially selected number starting with zero that is assigned to a route as the ROUTE-SETUP message for that route arrives. The LPID is entered into the table, and sent back to the previous node for entry into that node's routing table. Each routing table, in this embodiment, has the LPID it assigns, the outbound link to the next node, and the LPID assigned by the next node in the route. When a message arrives at a node in this embodiment, the LPID for that node is extracted from the header and used to locate the table entry for that session. The next node's LPID, located in the table, is then exchanged for the incoming LPID. The message is then sent on to the next node via the assigned outbound link, and so forth. FIG. 8 illustrates a routing table 90 including a unidirectional entry 88 for a hypothetical route, using the LPID method. As shown, there are three elements to an entry, an LPID 94, the outbound link ID 96, and the LPID for the next node 98.

After the information necessary for the routing table entry is extracted from the ROUTE-SETUP message, it is sent on to the the next element, and so on, to create all of the necessary table entries for the route. If all nodes and links in the end-to-end route are active, the ROUTE-SETUP will be successful and an end-to-end route will be created.

Each routing table entry in which each node traversed is marked as operative. If a node cannot forward the ROUTE-SETUP message to the next node because either the link to that node or the node itself is inoperative, then a ROUTE FAILURE message identifying the inoperative link or node is generated and returned to the route origin for forwarding to the topology data base. The inoperative status is marked in the topology data base and that network element is not used in subsequent ROUTE-SETUP messages until its status changes.

Figure 9:
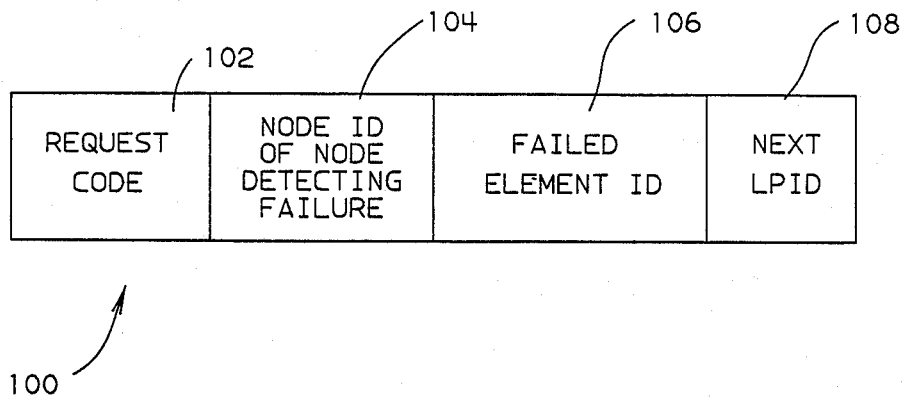
FIG. 9 is a schematic representation of a ROUTE FAILURE message in accordance with the present invention.

As the ROUTE FAILURE message returns through each node identified in the ROUTE-SETUP, each node's routing table entry remains intact, with the status of the route being marked as inoperative. These table entries are used for the feedback mechanism to the end node (and its topology data base) when the failed element is re-activated. The ROUTE FAILURE message is transmitted by following the node routing table entries set up from the failed ROUTE-SETUP message. FIG. 9 illustrates a ROUTE FAILURE message 100 for an LPID-based network. It includes a Request Code 102 identifying the message as a ROUTE FAILURE message, the node ID of the node detecting the failure 104, Failed Element ID 106, and Next LPID 108.

When the node that reported the ROUTE FAILURE (the "adjacent node") detects that the inoperative element subsequently has become operative, a ROUTE ELEMENT OPERATIVE message is created and sent to the origin node for forwarding to its topology data base. The topology data base then resets that element's status entry to operative. The element is then available for subsequent ROUTE-SETUP attempts. The ROUTE ELEMENT OPERATIVE message is identical to a ROUTE FAILURE message (100, FIG. 9), except that the Request Code identifies it as a ROUTE ELEMENT OPERATIVE message.

If more than one route had attempted to use the inoperative element, more than one set of routing table entries would have been created in the adjacent node and for as many of those sets of entries as had been created, ROUTE ELEMENT OPERATIVE messages would be created and sent back to the corresponding origin nodes for resetting of their topology data base entries for that element to operative.

This notification flows to the route origin node by following the node routing table entries set up from the failed ROUTE-SETUP message, in the same manner as the ROUTE FAILURE message.

The same process is used after an end-to-end route is successfully established and a failure occurs on a link or node in the route. The same ROUTE FAILURE message is returned, in this case to both end nodes, the origin and the destination node, for forwarding to the topology data base of each end node. The ROUTE FAILURE message identifies the failing element, and as in the initial case of failure to set up the route, the routing table entries in the route segments to the end nodes remain intact as the message travels back to the end node. As in the previous case, when the failed element becomes operative, the node routing table entries are used by ROUTE ELEMENT OPERATIVE messages (one in each direction around the point of failure) to follow the route back to the end node for forwarding to the topology data base(s) to indicate the operative status of the network element.

In either case, as the ROUTE ELEMENT OPERATIVE messages flow to the topology data base(s), the routing table entries are removed from the nodes along the route to recover the routing table space just as if the end-to-end route were being normally deleted after the termination of all sessions using the route.

The feedback mechanism functions in the face of both single point and multiple point failures along the route, as described in greater detail below.

The basic elements of the feedback mechanism of the preferred embodiment can be described by a set of rules, definitions, states and protocols which may be applied to any communication network having dynamic routing of the type herein described. The protocols are described in four operational cases.

RULES OF OPERATION, DEFINITIONS & STATES

1. Topology Data Base

There will exist one or more topology data bases which contain network node, connectivity and status data which can be used to select an end-to-end route through a communication network.

For each route element (that is, for each network node, which can be either source, destination, or intermediate node host or communication processor; and for each link, which can be either teleprocessing link, channel connection, local teleprocessing loop, Local Area Network, fiber optic line, or any other medium which can connect two host or communication processor nodes), there exists a set of parameters as follows:

| Element | Identifiers | Connectivity | Characteristics | Status |
|---|---|---|---|---|
| Node | Node Name<br>Node Address | Adjacent nodes | Message Storage<br>Capacity<br>Processing Power<br>Security | Operative<br>Inoperative<br>Unknown/<br>(Assumed Operative) |
| Link | Link Name<br>Link Address | Adjacent nodes | Bandwidth<br>Reliability<br>Security | Operative<br>Inoperative<br>Unknown/<br>(Assumed Operative) |

These characteristics are well known in the art.

Various methods can be utilized to create the entries and element knowledge in the topology data base. They include operator input, a system generation process, automatic element identification at element activation, etc.

2. Route Selection Algorithm

The algorithm(s) utilized to select a route (i.e., secure, least delay, greatest bandwidth, etc.) should not affect the operability of the invention in a network, provided the selection algorithm adheres to the rules for creation of the selected route list and element status described above.

3. Route Request Mechanism

A mechanism is provided to allow a user to request an end-to-end route from source to destination nodes through the network. This request is sent to a topology data base with an indication as to the characteristics (secure, least delay, etc.) desired. The request initiates the route selection process in the topology data base and creates a ROUTE-SETUP message.

4. ROUTE-SETUP Message

This is a message which contains the list of nodes and links selected to create the end-to-end route from source to destination nodes. The ROUTE-SETUP message traverses the network, from the source to the destination, node to link to node to link, etc., in the order specified in the ROUTE-SETUP message. As it traverses the proposed route, routing tables are created in each node traversed, the forward and backward adjacent node connections being indicated by entries in the routing table. The ROUTE-SETUP can have one of two replies: ROUTE-SETUP-REPLY message or ROUTE-FAILURE message.

5. ROUTE-SETUP-REPLY Message

This message is issued from the destination back to the source on a successful creation of a route.

6. The ROUTE-FAILURE Message is returned for a failed ROUTE-SETUP attempt, and for the failure of an element in a successfully-created route. In the case of a failed ROUTE-SETUP attempt, when a network node cannot continue to forward the ROUTE-SETUP message to its neighbor, it creates a ROUTE-FAILURE message. This message, illustrated in FIG. 9, is returned to the source to be forwarded to the topology data base. This ROUTE-FAILURE message indicates which node detected the inoperative network resource. The topology data base records the status of the inoperative element (i.e., L3) and does not reuse this element for other ROUTE-SETUP attempts until subsequently informed that the element is operative by the ROUTE-ELEMENT-OPERATIVE message. In the case of the failure of an element on an established route, the same ROUTE-FAILURE message is created, and for the same purpose, but in this case, it is sent to both participating end nodes.

7. The ROUTE-ELEMENT-OPERATIVE Message is created by a node when it detects the reactivation of an inoperative element. The ROUTE-ELEMENT-OPERATIVE message is created and sent provided that a ROUTE-SETUP message has flowed prior to the element changing from inoperative to operative. The ROUTE-ELEMENT-OPERATIVE message traverses the network back to the origin node by using the routing table entries from the earlier ROUTE-SETUP MESSAGE.

8. ROUTE-DELETE Message

This message is sent on the route to signal that the route is no longer needed. It is created by the route end-points (either source or destination node) when all sessions assigned to a specific end-to-end route have ended. As the ROUTE-DELETE message traverses the network, each node in its path frees the routing table entries assigned to that specific route and forwards the message on the route being deleted. The ROUTE-DELETE message has no effect on the element status in the topology data base since this message only issues on active routes and the element status is not changed from their currently OPERATIVE state.

9. Resource State

Each element (node, link) can have three states: UNKNOWN-ASSUMED OPERATIVE (UNK), OPERATIVE (OP), or INOPERATIVE (INOP). If an element is in the OP or UNK state, it can be utilized for route selection purposes. In the INOP state, the element cannot be utilized for route selection until it is marked UNK or OP.

(a) UNKNOWN-ASSUMED OPERATIVE STATE SETTING (1) All elements are considered UNK when the topology data base is activated or when a new element is added to an already existing topology data base.

(2) An element in the INOP state is changed to UNK if another element on the same INOP route but closer to the topology data base also fails. This is done to ensure that an element does not stay INOP indefinitely because a ROUTE-ELEMENT-OPERATIVE report could not reach the topology data base due to a second outage.

(b) OPERATIVE STATE SETTING (1) Elements change from UNK to OP when a ROUTE-SETUP-REPLY message is received.

(2) Elements changed from INOP to OP when an element which prevents the success of a ROUTE-SETUP request becomes operative, causing the generation of a ROUTE-ELEMENT-OPERATIVE message.

(c) INOPERATIVE STATE SETTING (1) A ROUTE-FAILURE resulting from a ROUTE-SETUP attempt causes a state change to INOP for the identified inoperative element over which the ROUTE-SETUP could not be forwarded.

(2) A ROUTE-FAILURE notification on an active route causes a state change to INOP for the identified failed element.

10. Node Routing Tables

Each network node contains a node routing table which is used to route messages through the network. The node routing table is constructed dynamically as required by routes, using the ROUTE-SETUP mechanism. Each entry consists of forward and backward pointers to the outbound queues associated with the "next leg" of the message journey in each direction as well as the status or state of the entry. If the node is the source or destination node for the route, this is also indicated in the table entry.

There are two states that each node routing table entry can have: OP or INOP. The OP state is set when the route is created. The INOP state is set by the following conditions:

(a) A ROUTE-FAILURE notification is returned from a ROUTE-SETUP attempt.

(b) A ROUTE FAILURE notification is received on an active route.

The state entry in the routing table can be used by an operator for information purposes (e.g., operator inquiries), and by a node to cut off further messages on an established route that has a ROUTE FAILURE message propagating back to it, thus freeing valuable link time.

11. Protocols

The feedback mechanism of the preferred embodiment of the present invention incorporates certain protocols to ensure proper notification of the topology data base(s) about the status of resources on a dynamically created route within a network.

These protocols are described using four cases covering critical network events. They are:

(1) The notification of the topology data base when a failed element (one in a previously used route) becomes reactivated.

(2) The double failure case where two elements fail on an active or pending-active route.

(3) The discovery of an inoperative element during a ROUTE-SETUP attempt.

(4) The failure of an element in a pending-active route after the ROUTE-SETUP message has passed the failing link but before the ROUTE-SETUP-REPLY has been returned over the failing link.

Case 1: Route Failure and Subsequent Notification After Recovery

Figure 10:
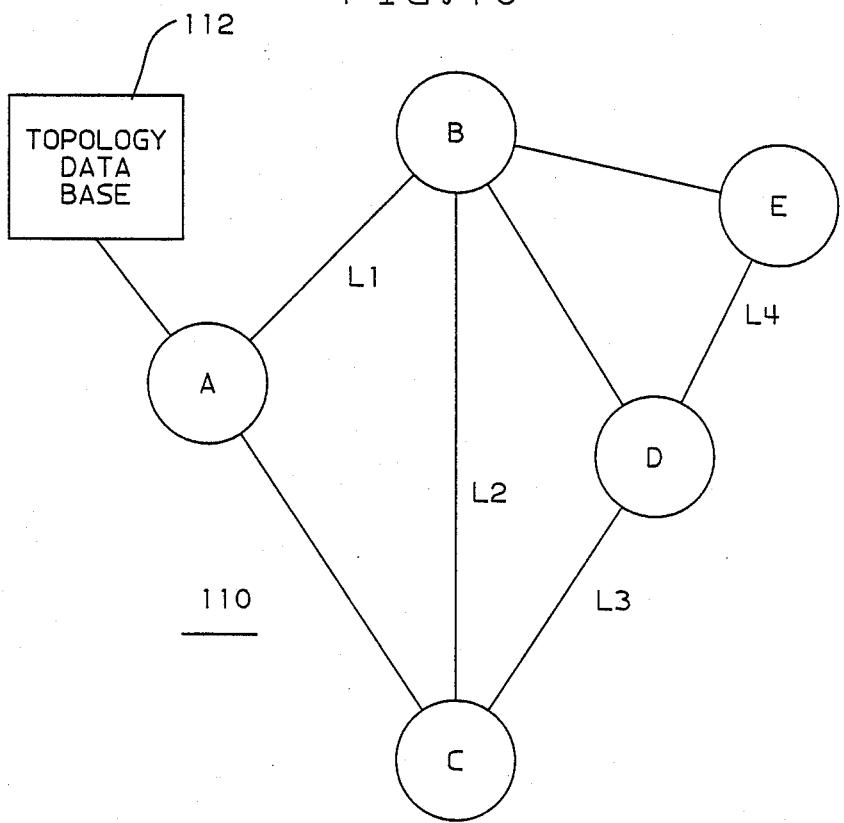
FIG. 10 is a schematic representation of a network with a topology data base.

Assume that a dynamic route A-L1-B-L2-C-L3-D-L4-E has been created in the network 110 depicted in FIG. 10 for a session between nodes A and E. In nodes A, B, C, D, and E the route table entry states are OP. Assume that a topology data base 112 was utilized, at node A, to choose the route elements comprising this route and that the states of all the network elements in the database are OP. The rules of operation are as follows, assuming a failure of link L2 and considering the processing at nodes B and A. The processing at nodes C and E would be similar.

(a) The failure of L2 is detected by both nodes B and C.

(b) In this example Node B creates a ROUTE-FAILURE message and sends it to Node A, for forwarding to its topology data base.

(c) As the ROUTE-FAILURE notification traverses the network to node A, the routing table entry for that route in each node in the direction away from the failed element (i.e., B to A) is marked INOP but remains in the node routing table.

(d) The ROUTE-FAILURE notification causes the topology data base at A to mark the link L2 as INOP so that it is not subsequently used to initiate another ROUTE-SETUP attempt through L2.

(e) When link L2 becomes operative, node B searches its node routing table to find the entries which are marked INOP and which previously utilized L2 in their outbound path. Then node B creates ROUTE-ELEMENT-OPERATIVE messages for the routes corresponding to each such entry. In this example the ROUTE ELEMENT OPERATIVE message indicates that L2 is now OP and is transmitted along the route back to node A. Each node in the path, upon forwarding this ROUTE-ELEMENT-OPERATIVE message, deletes the route's entry from its node routing table.

(f) When the ROUTE-ELEMENT-OPERATIVE message reaches node A, it is forwarded to the topology data base supporting Node A. The topology data base then updates its element status for L2 to OP so that L2 can be used for a new ROUTE-SETUP attempt.

Similar processing occurs in the opposite direction from node C to node E, including node D, and to the topology data base supporting node E if different from that of Node A.

CASE 2: DOUBLE FAILURE CASE

Consider the same network depicted in FIG. 10. Assume again that a route was created from A to E through each node using L1, L2, L3 and L4. Consider the following events: first link L3 fails, then link L2 fails. The following will occur.

(a) Node C detects L3 failure. Node C scans its node routing table and when it finds an entry with an outbound link of L3, it sends a ROUTE-FAILURE notification in the reverse direction (i.e., to node B). The routing table entries in nodes C, B, and A are left in the routing tables but are marked INOP. At node A, the ROUTE-FAILURE message is given to the topology data base where the element entry for L3 is marked INOP. Similar processing is performed in the direction of node E as node D detects the L3 failure.

(b) Node B detects L2 failure and, scanning its node routing table, sends a ROUTE-FAILURE identifying L2 as failed to A using the already inoperative route. Node A forwards this notification to the topology data base. Both nodes A and B leave their routing table entries in the INOP state.

(c) When the topology data base receives this second ROUTE-FAILURE notification for the same route, although for a different failed element, it scans its topology data base and marks the original failed element (L3) as UNK, unless L3 is known to be INOP because of its presence in another route, and marks the newly-failed element (L2) as INOP. At this point, several conditions can occur, dealing with the time at which L2 or L3 become operative. Each condition is described below.

(1) Assume L2 becomes operative while L3 remains inoperaive. When L2 becomes operative, node B uses the method described in Case 1 to notify the topology data base that L2 is now available. Also, the routing table entries in B and A are deleted. The topology data base then marks L2 as OP. A ROUTE-SETUP request can be sent to establish the route (assuming a session wants to use the route) and will fail at the L3 link. The partially-constructed route segment will remain, awaiting L3's becoming operative again.

(2) Assume L3 becomes oprative but L2 does not. In this case, the topology data base does not get the notification since L2 is not operative and blocks the path to origin Node A. This does not cause problems, however, because the topology data base had assumed L3 was operative (i.e., UNK) after L2 failed, anyway.

(3) Assume L3 becomes operative, followed by L2 becoming operative. This is handled as in items (2) and (1) above except that now ROUTE-SETUP succeeds because L3 is operative. Processing of this double failure from the point of view of nodes D and E is similar to B and A except in the opposite direction. Node routing table entries in nodes D and E are marked as INOP for traffic flowing in the direction toward the failure.

Note: When a routing table entry becomes INOP in both directions, the entry is deleted from the table. In this case the node has become isolated by failure on each side somewhere along the route, and routing table entries are not needed for later ROUTE ELEMENT OPERATIVE notification. In this case, Node C deletes its routing table entry, and only nodes B and D transmit a ROUTE ELEMENT OP message to the route endpoint.

CASE 3: DISCOVERY OF AN INOPERATIVE ELEMENT DURING A ROUTE-SETUP ATTEMPT

This case is similar to case 1 processing except that rather than a ROUTE-FAILURE notification being issued on the existing route, the failure notification becomes part of the ROUTE-SETUP failure notification. As in case 1, the element in the topology data base which stopped the ROUTE-SETUP attempt is marked INOP. When the inoperative element becomes operative, then the same processing as described in Case 1 items (e) and (f) is done.

CASE 4: FAILURE OF A RESOURCE AFTER A ROUTE-SETUP MESSAGE HAS PASSED THE JUST FAILED ELEMENT

This case is similar to Case 1 except that failure notification is for a pending-active node routing table entry (since ROUTE-SETUP-REPLY has not been received) instead of for a fully-activated entry. Processing is the same for the adjacent node detecting the failure. The notification that the failed element has become operative occurs as stated in Case 1 items (e) and (f).

The above protocols may be implemented, as mentioned previously, in virtually any dynamic routing network to effect the principles of the preferred embodiment of the present invention. Additional standard expedients may be added as desired, for example, implementation of message codes, operator status inquiry commands for routing table entry values, and the like.

HANDLING OF FULL ROUTING TABLES IN NETWORK NODES

During network operation one or more network nodes might have their routing tables filled to capacity, such that no further routing entries can be made in those nodes until the condition is alleviated. The normal way for such alleviation to occur is for sessions to end and for routes that are no longer being used to be deleted from the network. It may also be desirable to have a topology data base intervene automatically to delete route segments that are awaiting the reactivation or recovery of some resource, or to have a network operator request a topology data base to perform such an intervention.

Accordingly, an embodiment of the present invention includes notification to a topology data base of the occurance of a routing table condition of "full" in a network node. The network node sends a message indicating the full routing table condition to its controlling node, which in turn passes the message to the topology data base in that controlling node. The topology data base either cancels outstanding route requests involving the affected node or requests manual intervention by the network operator in making the decision, depending on initial settings in the topology data base. In the former case, notification to the network operator may be given even though no operator decision is necessary.

If the topology data base itself or the network operator decides to remove pending route requests from the network, the topology data base sends the appropriate ROUTE-DELETE request(s) along the established route segment(s) to delete those entries from the routing tables of the nodes in the route segment.

REMOVAL OF NODES FROM THE NETWORK

A network operator can decide to temporarily or permanently remove a link or node from the network. Such a link or node resource might be currently active or might be awaiting reactivation or recovery from an earlier failure. Accordingly, an operator command to the topology data base may be included to reomve the representation of a resource from the network.

If the resource is active, user sessions dependent on the resource may be terminated or allowed to end normally, after which routes that include the resource are deleted in the normal manner by ROUTE-DELETE requests from a topology data base. After receiving a command to remove a resource from the network, the topology data base ceases using the resource in new ROUTE-SETUP requests.

If a link or node resource is awaiting reactivation or recovery when it is removed from the network, pending route requests dependent on the resource are cancelled. After receiving a command to remove a resource from the network, the topology data base issues ROUTE-DELETE requests for all pending route requests involving the removed resource and does not attempt to establish any new routes using that resource.

The present invention, as illustrated by the above description, provides a system for notifying a network topology data base of the availability of potential communication among the various elements of a communication network with greatly reduced network traffic as compared with prior art approaches. The considerable proliferation of status messages in the network is greatly reduced by the application of the present invention, and a minimal but sufficient class of nodes is given necessary availability information to create session routes efficiently and with a minimum of unnecessary utilization of network resources.

While the invention has been described with reference to preferred embodiments thereof, it will be understood by those skilled in the art that various changes in form and details may be made without departing from the scope of the invention.

What is claimed is:

1. A digital data message transmission network, comprising:
   (a) a plurality of network elements comprising message transmitting/receiving nodes and communication links interconnecting said nodes;
   (b) means associated with each node for storing data corresponding to the availability of said network elements to communicate;
   (c) means associated with each node for using said stored data to select a communication path made up of selected elements interconnecting that node with another node in said network;
   (d) means for establishing said communication path between an origin node and a destination node;
   (e) means, associated with said means for establishing said communication path, for storing data identifying all of said communication path if said communication path is completed, or if completion of the said communication path is prevented because of an unavailable element, the segment of said communication path between said origin node and the node adjacent the unavailable element; and
   (f) means, responsive to the detection of the unavailability of an element in said communication path, for using data from said means for storing data identifying said path or path segment, as the case may be, to generate and selectively send data as to the unavailability of said unavailable element along the segment of said path between the node adjacent said unavailable element and said origin node.

2. A digital data message transmission network according to claim 1, wherein:
   (a) said means for using said stored data to select a communication path comprises means for generating a ROUTE-SETUP message including information as to the communication originating node (the "origin node"), information as to the communication destination node (the "destination node"), information as to the identity of each element in said communication path, and a route identifier ("route ID");
   (b) said means for establishing said communication path comprises
      (i) means for sending said ROUTE-SETUP message to the first node in said route using the first link in the route, and
      (ii) means at each node in said route for receiving said ROUTE-SETUP message, for creating a table in such node identifying the inbound and outbound links of such node for said route to permit the subsequent receipt of messages and transmission on the proper links for said route thereafter, and for sending said ROUTE-SETUP message to the next node in said route; and (c) said means for using data from said means for storing data comprises
  (i) means associated with each node for detecting the inoperative condition of the communication links connected thereto,
  (ii) means for sending back to said origin node information as to the inoperative condition of a communication link connected thereto by way of the table entries set up by said ROUTE-SETUP message in the nodes intermediate the node detecting the inoperative condition and the origin node, and
  (iii) means for detecting the operative condition of a previously inoperative communication link and for sending back to said origin node information as to the operative condition of said previously inoperative communication link by way of the table entries set up by said ROUTE-SETUP message in the nodes intermediate the node detecting the operative condition and the origin node.

3. A network according to claim 2 in which said means for sending back to said origin node information as to the inoperative condition of a communication link is responsive to the receipt of a ROUTE-SETUP message.

4. A network according to claim 2 in which said means for sending back to said origin node information as to the inoperative condition of a communication link is responsive to the detection of said inoperative condition.

5. A network as set forth in claim 1, wherein said means for storing data identifying said communication path, or said segment of said communication path, as the case may be, comprises a set of entries in tables in each node in said path or path segment identifying the nodes in said path or path segment.

6. A network as set forth in claim 1, wherein said means for using data from said means for storing further comprises means, responsive to the detection of the availability of said previously unavailable element, for using data from said means for storing data identifying said path or path segment, as the case may be, to generate and selectively send data as to the availability of said previously unavailable element, when said element becomes available, along the segment of said path between the node adjacent said previously unavailable element and said origin node.

7. A method for establishing a communication path between nodes in a digital message transmission network including a plurality of network elements comprising message transmitting/receiving nodes and communication links interconnecting said nodes, and for gathering data as to the availability of network elements to communication, comprising the steps of:
  (a) storing data, corresponding to those network elements potentially available to communicate, in a storage element associated with each node that may attempt to establish a communication path;
  (b) using said stored data to select a communication path made up of selected elements interconnecting an origin node originating a communication path with another node in said network;
  (c) attempting to establish said communication path;
  (d) storing data identifying all of said communication path, if said communication path is completed, or if said communication path is prevented because of an unavailable element in the segment of said communication path between said origin node and the node adjacent the unavailable element; and
  (e) responsive to the detection of the unavailability of an element in said communication path, using data from said means for storing data identifying said path or path segment, as the case may be, to generate and selectively send data as to the unavailability of said unavailable element along the segment of said path between the node adjacent said unavailable element and said origin node.

8. A method for establishing a communication path between nodes in a digital data message transmission network including a plurality of network elements comprising message transmitting/receiving nodes and communication links interconnecting said nodes, and for gathering data as to the availability of network elements to communicate, comprising the step of:
  (a) storing data, corresponding to those network elements potentially available to communicate, in a storage element associated with each node that may attempt to establish a communication path;
  (b) selecting a communication path made up of selected elements interconnecting an origin node with a destination node based upon said stored data;
  (c) attempting to establish said communication path by testing each of said selected elements to determine its availability for said communication path;
  (d) storing data identifying completed segments of said communication path;
  (e) responsive to the determination that an element in said communication path is unavailable, generating data indicating said element is unavailable and selectively sending said data along the completed segments of said communication path between the node adjacent said unavailable element and said origin node.

9. The method of claim 8 further comprising the steps of:
  (f) periodically testing said unavailable element to determine its availability for said communication path;
  (g) responsive to the determination that said element is available, generating data indicating said element is available and selectively sending said data along the completed segments of said communication path between said mode adjacent said element and said origin node.

10. The method of claim 9 further comprising the step of:
  removing data identifying said completed segment of said communication path from storage after selectively sending said data along said segments.

* * * * *